(12) United States Patent
Chao et al.

(10) Patent No.: US 8,216,480 B2
(45) Date of Patent: Jul. 10, 2012

(54) NANOPIN MANUFACTURING METHOD AND NANOMETER SIZED TIP ARRAY BY UTILIZING THE METHOD

(75) Inventors: Liang-chiun Chao, Taipei (TW); Chung-chi Liau, Taipei (TW); Jun-wei Lee, Taipei (TW)

(73) Assignee: National Taiwan University of Science and Technology, Taipei (TW)

( * ) Notice: Subject to any disclaimer, the term of this patent is extended or adjusted under 35 U.S.C. 154(b) by 938 days.

(21) Appl. No.: 12/251,584

(22) Filed: Oct. 15, 2008

(65) Prior Publication Data
US 2009/0252889 A1    Oct. 8, 2009

(30) Foreign Application Priority Data
Apr. 8, 2008    (TW) .............................. 97112590 A

(51) Int. Cl.
B44C 1/22    (2006.01)
(52) U.S. Cl. .......... 216/11; 216/66; 250/492.3; 977/876
(58) Field of Classification Search .................... 216/11, 216/66; 250/492.3; 977/876
See application file for complete search history.

(56) References Cited

U.S. PATENT DOCUMENTS

| | | | | |
|---|---|---|---|---|
| 5,599,749 A | * | 2/1997 | Hattori | 216/11 |
| 7,276,389 B2 | * | 10/2007 | Kim et al. | 438/34 |
| 7,981,305 B2 | * | 7/2011 | Koh et al. | 216/58 |
| 2009/0133171 A1 | * | 5/2009 | Jin | 850/60 |

OTHER PUBLICATIONS

Auciello, O., Multicomponent and multilayered thin films for advanced microtechnologies: techniques, fundamentals, and devices, Springer, 1993, pp. 170-171.*
Chao et al, Fabrication of Zinc nanotip arrays by ion beam sputtering (J. Vac. Sci. Technol. B, vol. 25, No. 6, Nov./Dec. 2007).*

* cited by examiner

*Primary Examiner* — Shamim Ahmed
(74) *Attorney, Agent, or Firm* — Kirton McConkie; Evan R. Witt

(57) ABSTRACT

Methods to manufacture metal nanopins and metal oxide nanopins are disclosed. Metal nanopins are fabricated on a metal foil by capillaritron plasma source dry etching. The aspect ratio and the density of metal nanopins are controlled by adjusting the temperature of the metal foil during ion beam dry etching. The end radius of metal nanopins less than 10 nm and the aspect ratio of metal nanopins between 25 and 30 can be achieved. Besides, metal oxide nanopins are fabricated by ion implantation and thermal oxidation. The metal foil is implanted with ions and then thermally oxidized to form the metal oxide nanopins. It shows that the metal oxide nanopins fabricated with oxygen implantation exhibit better field emission properties.

13 Claims, 8 Drawing Sheets

NANOPIN MANUFACTURING METHOD AND NANOMETER SIZED TIP ARRAY BY UTILIZING THE METHOD

TECHNICAL FIELD OF THE INVENTION

The present invention relates to a nanopin manufacturing method, and more particularly, to a method that utilizes ion beam implantation and/or thermal oxidation for manufacturing nanopins. In addition, the present invention changes the temperature of sample for altering the nanopin tip angle.

BACKGROUND OF THE INVENTION

Flat panel displays have become mainstream products in the market. More and more types of flat panel displays are being marketed. For example, liquid crystal displays (LCDs) and emissive flat panel displays are two types of flat panel displays. Liquid crystal displays may be divided into groups such as thin-film transistor liquid crystal displays (TFT-LCDs), twisted nematic (TN) LCDs, super-twisted nematic (STN) LCDs, and ferroelectric liquid displays (FLCDs). A liquid crystal display needs a back-light source in rear of display panel for emitting light to display the contents shown in front of the panel. However, the transmittance of liquid crystal display is only 10%. This is the reason why it is difficult to increase the brightness of liquid crystal display.

Emissive flat panel displays are superior to liquid crystal displays when it comes to the brightness of panels. The display principle of emissive flat panel displays is similar to that of traditional cathode ray tubes. They all utilize charged particles to impact a screen coated with fluorescent material for displaying information or graphics on that screen. Emissive flat panel displays are classified into various types such as field emission displays (FEDs), plasma display panels (PDPs), electroluminescent displays (EL displays), and organic light emitting diode (OLED) displays. Among those displays, field emission displays have many advantages, for example, high brightness, thin thickness, light weight, a wide range of visual angles, a wide range of operational temperature, little energy consumption and so on.

Instead of a single electron gun used in a traditional cathode ray tube, a field emission display uses a field emitter array which emits electrons by field emission. Presently, there are at least three kinds of field emitter arrays, respectively based on carbon nanotubes, nanometer scale diamonds, and zinc oxide nanopins. These kinds of field emitter arrays are manufactured mostly by chemical vapor deposition (CVD). However, it is necessary to use a great amount of chemical reagents for growing desired nanotip structures at high temperature. These chemical reagents may cause pollution or damage to the environment. In addition, the processes to manufacture the three kinds of field emitter arrays are complicated, and a lot of time would be needed. At the present time, environmental protection, energy saving and high efficiency are highly emphasized. Therefore, there is a need to develop a method to overcome the above-mentioned disadvantages.

SUMMARY OF THE INVENTION

An objective of the present invention is to provide a nanopin manufacturing method for fabricating nanopins on a substrate in a simple process. Particularly, environmental protection and time reduction are considered.

Another objective of the present invention is to provide an array of nanopins which is applicable to a field emitter array in a field emission display.

In accordance with an aspect of the present invention, utilizing a crystal anisotropic hardness property, nanopins are fabricated on a foil by ion beam dry etching. The aspect ratio and the density of the fabricated nanopins can be altered by adjusting the energy and the current density of ion beam. A capillaritron plasma source is the most important device required for the present invention. No chemical reagents will be needed. The nanopin manufacturing method according to the present invention has an advantage of low cost, and is harmless to the environment. The foil employed can be a zinc foil, a tungsten foil, or a tantalum foil. If a zinc foil is utilized to fabricate zinc nanopins, the nanopin end radius of less than 10 nm and an aspect ration between 25 to 30 can be achieved. The field emission measurement of the zinc nanopins indicates that electrons emits at a threshold field of 12.5 V/$\mu$m and a current density of 17 mA/cm$^2$ is achieved at an applied field of 14 V/$\mu$m.

According to the present invention, by controlling the temperature of the foil, cone-shaped nanostructures with various tip angles can be achieved. The higher the temperature of the foil is, the smaller the obtained tip angle and the greater the aspect ratio will be. If the foil is a zinc foil, then zinc nanopins with tip angles smaller than 3 degrees can be fabricated. The tip angles of the zinc nanopins can be controlled by altering the temperature of the zinc foil. By doing so, the threshold field applied to the zinc nanopins to emit electrons can be reduced.

In accordance with another aspect of the present invention, by ion beam implantation and thermal oxidation, metal oxide nanopins are fabricated on a metal foil polished with an ion beam. The present invention proposes two kinds of ion beam implantation, oxygen ion beam implantation and nitrogen ion beam implantation. Other kinds of ion beam implantation can be utilized as well. For an array of zinc oxide (ZnO) nanopins, before and after oxygen ion beam implantation, the field emission measurement of the ZnO nanopins indicates that the threshold field to emit electrons is reduced from 9.0 V/$\mu$m to 6.5 V/$\mu$m. In addition, when an electric field of 10 V/$\mu$m is applied, the current density of emitted electrons is increased from 20 $\mu$A/cm$^2$ to 170 $\mu$A/cm$^2$. The density of the ZnO nanopins and the field emission properties of the ZnO nanopins can be improved by nitrogen ion beam implantation. However, the field emission properties of the ZnO nanopins obtained by utilizing oxygen ion beam implantation is superior to that utilizing nitrogen ion beam implantation.

The metal and metal oxide nanopin manufacturing method provided by the prevent invention is harmless to the environment. The present invention does not use chemical reagents in the nanopin manufacturing process. In addition, the capillaritron plasma source utilized in the present invention is simple in structure and the manufacturing process is not complicated and time-consuming. Moreover, the nanopins fabricated according to the present invention, for example, Zn nanopins and ZnO nanopins, are good in quality and are quite suitable for applying to field emission arrays.

DETAILED DESCRIPTION OF THE INVENTION

For manufacturing nanopins, the present invention utilizes crystal anisotropic hardness properties and increases the temperature of samples. For a zinc crystal lattice, the hardness of each crystal plane is somewhat different. Some crystal planes are fragile while zinc atoms on some crystal planes are bound strongly. When the zinc crystal lattice is bombarded by accelerated particles, for example, bombarded by an ion beam, zinc atoms on the fragile crystal planes are easy to be stuck out. But for the crystal planes with great hardness, the zinc crystal lattice is hard to be destructed when bombarded by the ion beam. Since the crystal lattice is at a scale of nanometers, the crystal anisotropic hardness properties can be utilized to fabricate nanopins. In addition, increasing temperature of a metal foil makes the diffusion of surface atoms increasing. Therefore, tip angles of nanopins, formed on the metal foil by ion source dry etching at high temperature, are smaller than those tips angles formed at room temperature.

Figure 1:
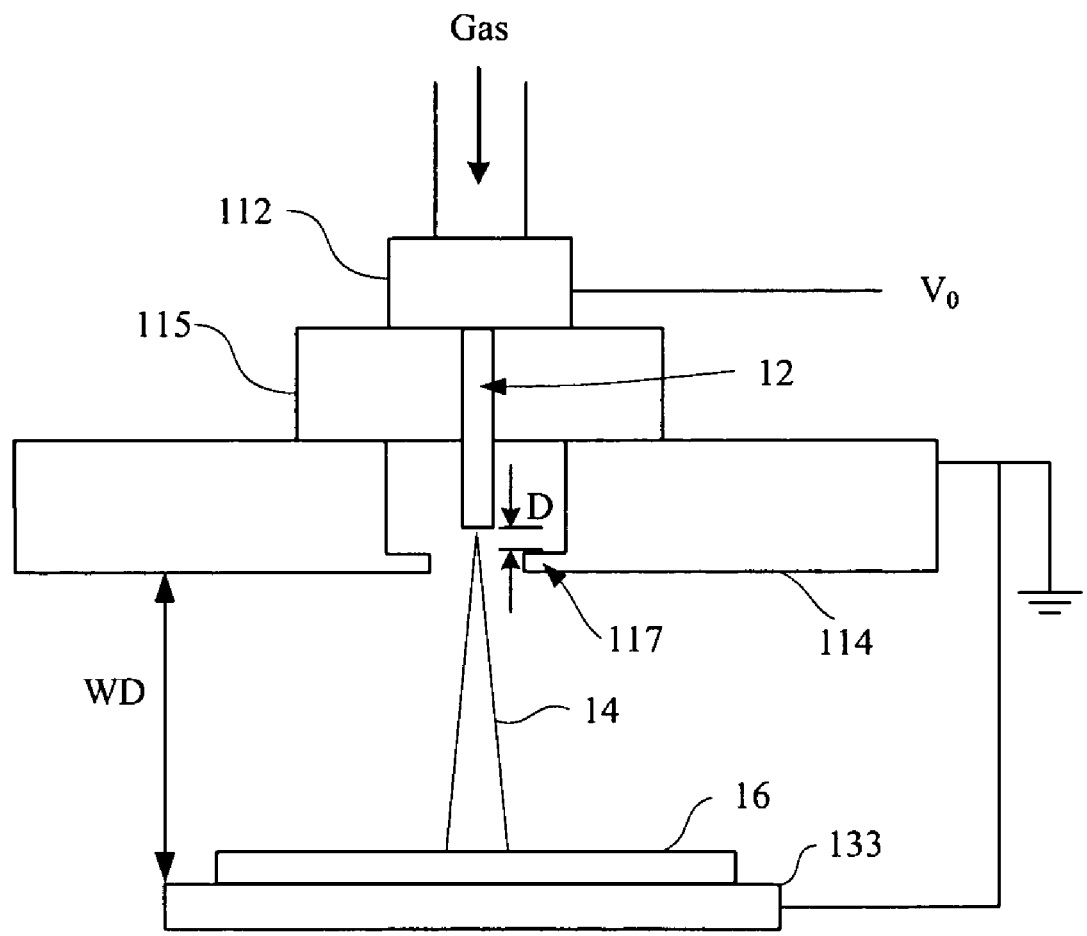
FIG. 1 shows a device for fabricating nanopins according to the present invention.

FIG. 1 shows a device for fabricating nanopins according to the present invention. The capillaritron plasma source utilized in the present invention comprises a capillaritron nozzle 12, a conductor 112, a draining metal electrode 114, and an insulator 115. The conductor 112 with a voltage $V_0$ applied to is arranged at an inlet side of the capillaritron nozzle 12. The draining metal electrode 114 which is grounded is arranged at an outlet side of the capillaritron nozzle 12. The insulator 115 is arranged between the inlet side and the outlet side of the capillaritron nozzle 12. A ceramic material can be employed as the insulator 115. Since the draining metal electrode 114 is grounded and the voltage $V_0$ is applied to the conductor 112, a voltage potential exists between the inlet side and the outlet side of the capillaritron nozzle 12. Therefore, gases introduced to the capillaritron nozzle 12 are plasmanized and accelerated by the electric field generated due to the voltage potential. The plasmanized gases are spurted to form an ion beam 14. The ion beam 14 bombards a foil 16 arranged on a sample stage 133. The sample stage 133 is grounded for avoiding redundant electric charges being accumulated on the foil 16. In addition, when fabricating nanopins, the device shown in FIG. 1 is arranged in a vacuum chamber (not shown), processing at low pressure. Moreover, the present invention proposes a nanopin manufacturing method described as follows: introducing a bombarding gas to pass through the capillaritron nozzle 12 for forming the ion beam 14; and bombarding the foil 16 with the ion beam 14 for forming an array of nanopins on a surface of the foil 16. A zinc foil, a tungsten foil, and a tantalum foil can be employed as the foil 16.

Figure 2:
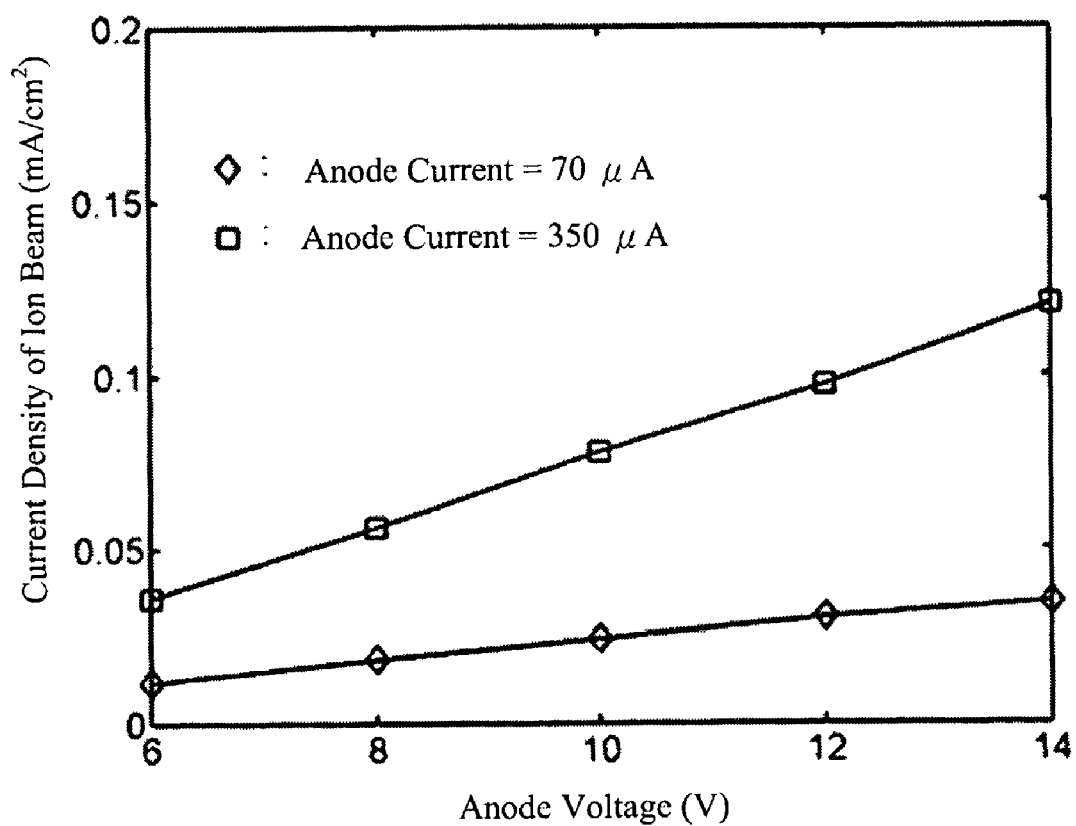
FIG. 2 depicts relation curves between anode voltage and current density of argon ion beam in a condition that a mass flow controller is utilized, and a anode current is 70 $\mu$A and 350 $\mu$A respectively.

To fabricate zinc nanopins, an experiment according to the present invention adopts a zinc foil with a thickness of 0.25 nm and a purity of 99.99%, produced by Alfa Aesar company. The distance between the outlet side of the capillaritron nozzle 12 and an upper surface of a tongue piece 117 of the draining metal electrode 114 is smaller than 1 mm (D□1 mm). The distance between the bottom of the draining metal electrode 114 and an upper surface of the sample stage 133 is 30 mm (WD=30 mm). The zinc foil is cut up into a size of 15 mm×15 mm and placed on the sample stage 133. In the experiment, vacuum pumping until the chamber vacuum reaches $5\times10^{-6}$ torr, an argon gas is introduced for serving as the bombarding gas. The flow rate of argon gas can be controlled by a mass flow controller. After the pressure in the vacuum chamber (not shown) is stable (roughly at a pressure of $10^{-4}$ torr), the voltage $V_0$ is applied for collapsing the molecular structure of the argon gas to form an argon ion beam, and then the argon ion beam impinges upon the zinc foil directly. The voltage applied to the conductor 112 is referred to as an anode voltage; the current applied to the conductor 112 is referred to as an anode current. The current density of the argon ion beam can be adjusted by controlling the flow rate of argon gas, the anode voltage, and the anode current. FIG. 2 depicts the relation curves between the anode voltage and the current density of argon ion beam in a condition that the anode current is 70 μA and 350 μA respectively.

Figure 3:
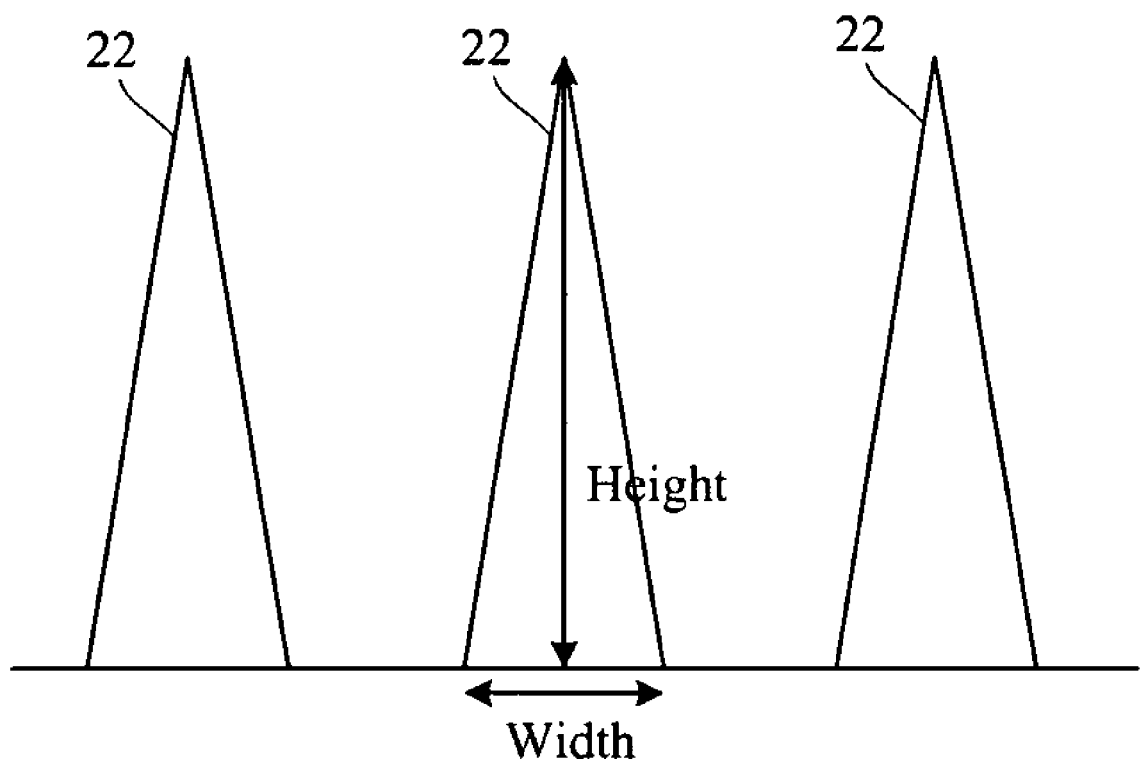
FIG. 3 illustrates an aspect ratio of nanopins.
Figure 4:
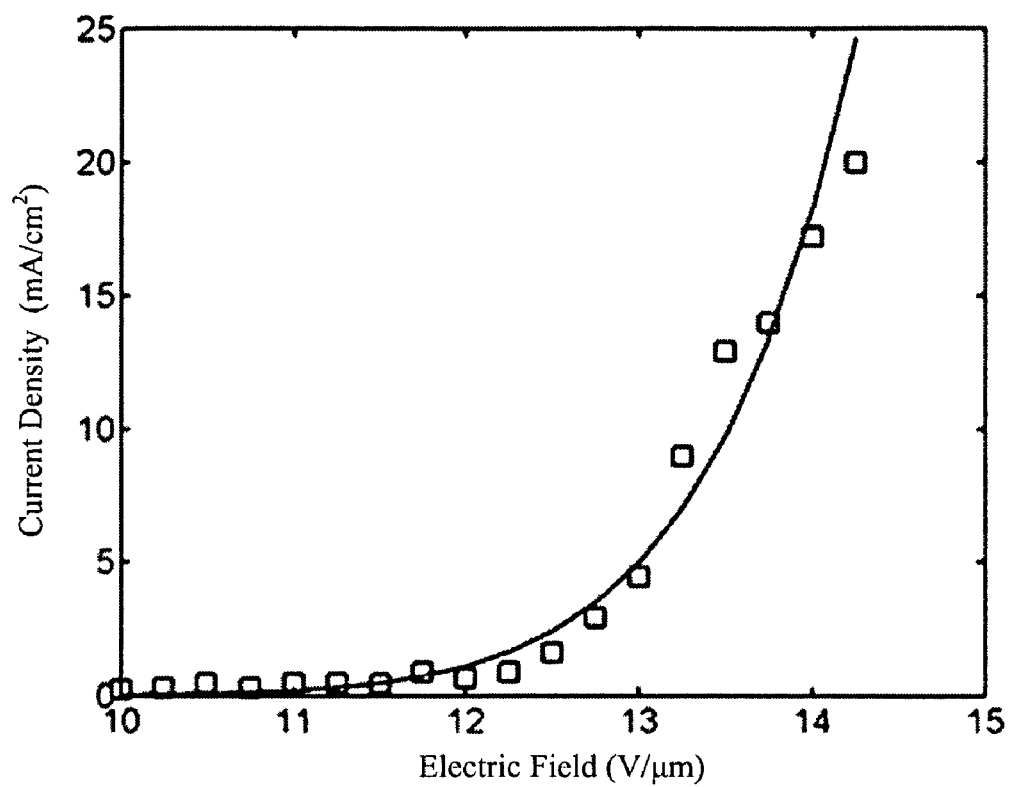
FIG. 4 depicts field emission measurement of fabricated zinc nanopins according to the present invention.

If the zinc foil is bombarded by an argon ion beam of 10 keV, anode current is 350 μA, and etching time is fixed in one hour, an end radius of fabricated nanopins less than 10 nm is achieved. In the meanwhile, an aspect ratio of fabricated nanopins greater than 25, or roughly between 25 and 30, can be obtained. FIG. 3 illustrates the aforesaid aspect ratio. The distance between the tip of nanopin 22 and the bottom of nanopin 22 is defined as height; the diameter of the circle in the bottom of nanopin 22 is defined as width. Generally, the smaller the end radius of nanopin is, the stronger an electric field distributed over the tip will be. As a result, the field emission electrons are easier to be generated when the tip angles of nanopins are small. On the other hand, the field emission current generated from the tips of nanopins is larger while the voltage is applied to the bottom of nanopins. In addition, generally, the greater the aspect ratio is, the smaller the end radius will be. Moreover, a field emitter array is usually designed into an array that is arranged by needle-like structures (the so-called nanopins) so as to acquire a strong equivalent electrical field without necessary to apply with a high operational voltage. The field emission properties relates with the needle-like structures. FIG. 4 depicts the field emission measurement of fabricated zinc nanopins. The field emission measurement of zinc nanopins indicates that electrons emits at a threshold field of 12.5 V/μm and a current density of 17 mA/cm² is achieved at an applied field of 14 V/μm. In addition, the aspect ratio and the end radius of fabricated zinc nanopins can be altered by adjusting the applied voltage and the current density of ion beam.

Figure 5A:
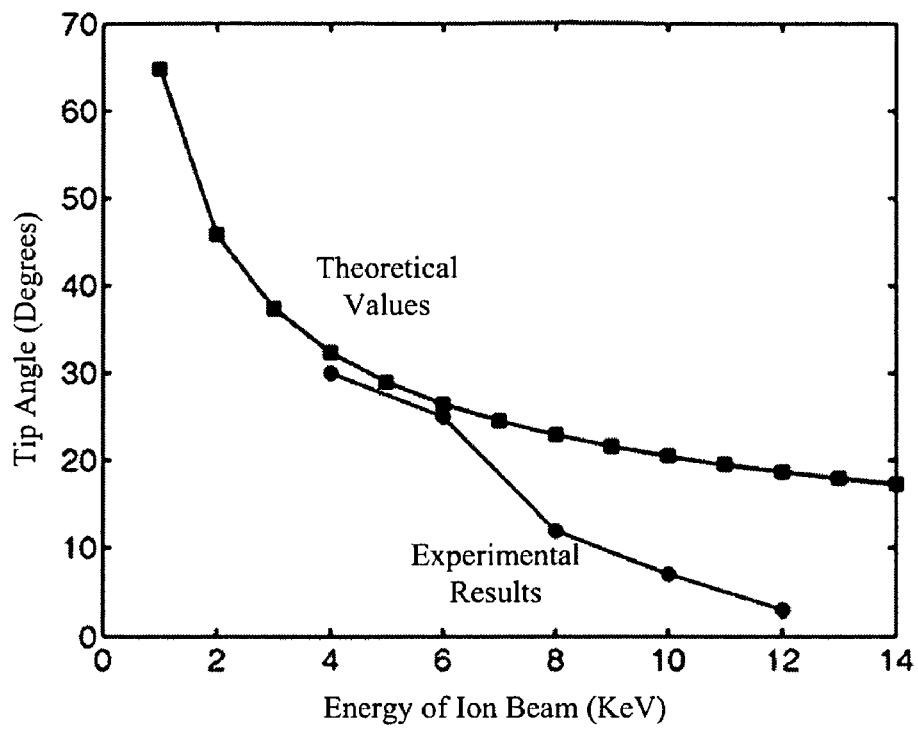
FIG. 5a depicts relation curves (an experimental curve and a theoretical curve) between tip angles of cone-shaped zinc nanostructures and energy of argon ion beam.
Figure 5B:
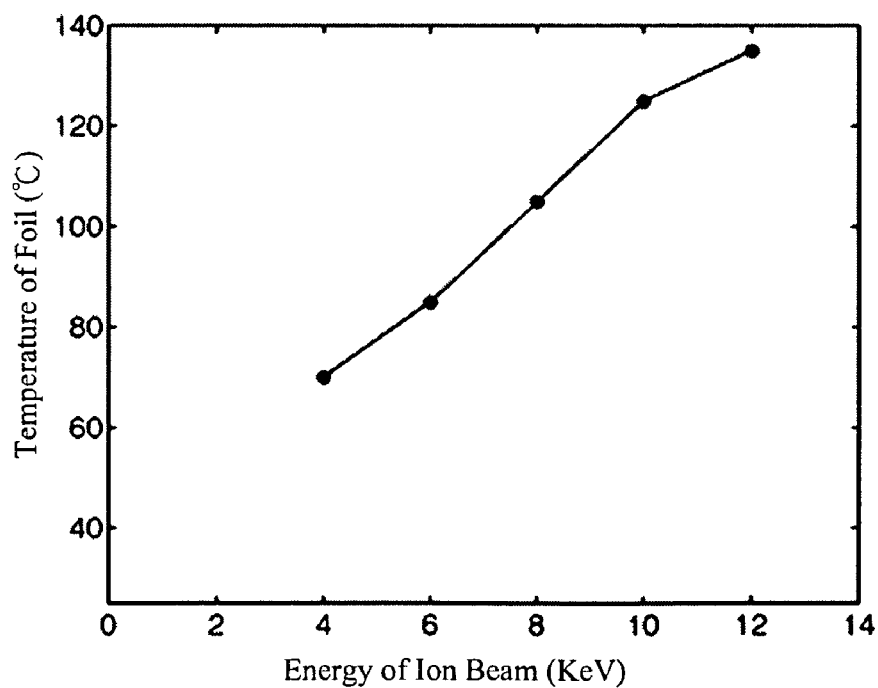
FIG. 5b depicts a relation curve between the temperature of zinc foil and energy of argon ion beam.

When the ion beam impinges upon the surface of the foil, by controlling the temperature of the foil, cone-shaped nanostructures with various tip angles can be achieved. The temperature of the foil varies with respect to the energy of the impinged ion beam. Increasing the energy of the ion beam will result in rising the temperature of the foil. The higher the temperature of the foil is, the smaller the obtained tip angle and the greater the aspect ratio will be. Please refer to FIG. 5a in accompany with FIG. 5b. If the zinc foil is bombarded by argon ion beam of 4 to 12 keV, anode current is 350 μA, and etching time is fixed in one hour, the temperature of the zinc foil increases from 70□ to 135□ as the energy of argon ion beam increases (shown in FIG. 5b). The experimental results of various tip angles of cone-shaped nanostructures are shown in FIG. 5a. It is indicated that the tip angles becomes smaller as the energy of the argon ion beam (or the temperature of the zinc foil) increases. FIG. 5a also shows simulation results. The simulation does not take surface diffusion of zinc atoms into consideration and it is assumed that the temperature of the zinc foil is maintained at room temperature. According to the simulation results, even thought the energy of the argon ion beam is increased to 14 keV, the smallest tip angle is 18 degrees yet. If a much smaller tip angle is to be obtained, it is necessary to heat the foil. In comparison with FIG. 5a and FIG. 5b, it can be known that the reason of tip angles becoming smaller is because rising the temperature of the foil will result in increasing the surface diffusion. When the foil is heated, the binding energy of atoms in materials is varied. This affects the behavior of atoms sputtering from the surface of the foil. For the zinc nanopins fabricated according to the present invention, their tip angles lie in a quite wide range as known from FIG. 5a. Generally, the smaller the tip angles are, the better the field emission effect will be. Applying the present invention, the tip angles of nanopins can be altered by controlling the temperature of the foil.

The present invention also utilizes ion beam implantation and thermal oxidation for fabricating metal oxide nanopins on a metal foil polished by an ion beam. The density of the nanopins and the field emission properties of the nanopins can be improved. A method to fabricate metal oxide nanopins by the ion beam implantation comprises steps of: (1) bombarding a foil with an ion beam formed by a plasmanized bombarding gas; (2) impinging upon the foil with an implanting ion which is plasmanized from an implanting gas; (3) after implantation, the foil is heated or oxidized in an oxidation furnace, and then the metal oxide nanopins are formed on the foil. The bombarding gas can be an argon gas, and the implanting gas can be an oxygen gas and a nitrogen gas. If the oxygen gas is utilized as the implanting gas, it is referred to as oxygen ion beam implantation; if the nitrogen gas is utilized as the implanting gas, it is referred to as nitrogen ion beam implantation. In summary, the density of the nanopins and the field emission properties of the nanopins can be improved by utilizing the ion beam implantation. The present invention proposes two kinds of ion beam implantation, oxygen ion beam implantation and nitrogen ion beam implantation. Other kinds of ion beam implantation can be utilized as well.

Figure 6B:
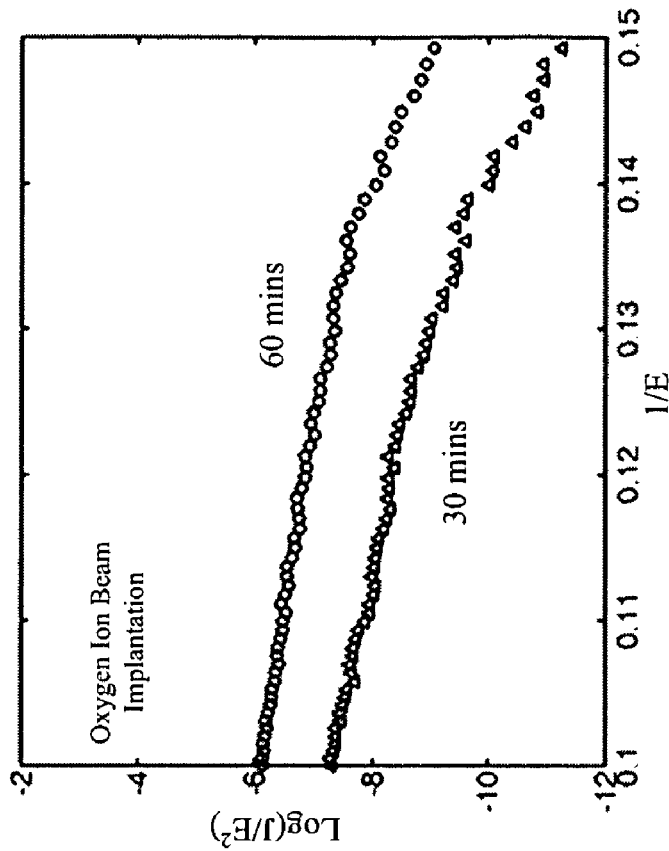
FIGS. 6a and 6b depict field emission measurement of ZnO nanopins which are fabricated by oxygen ion beam implantation and thermal oxidation.
Figure 6A:
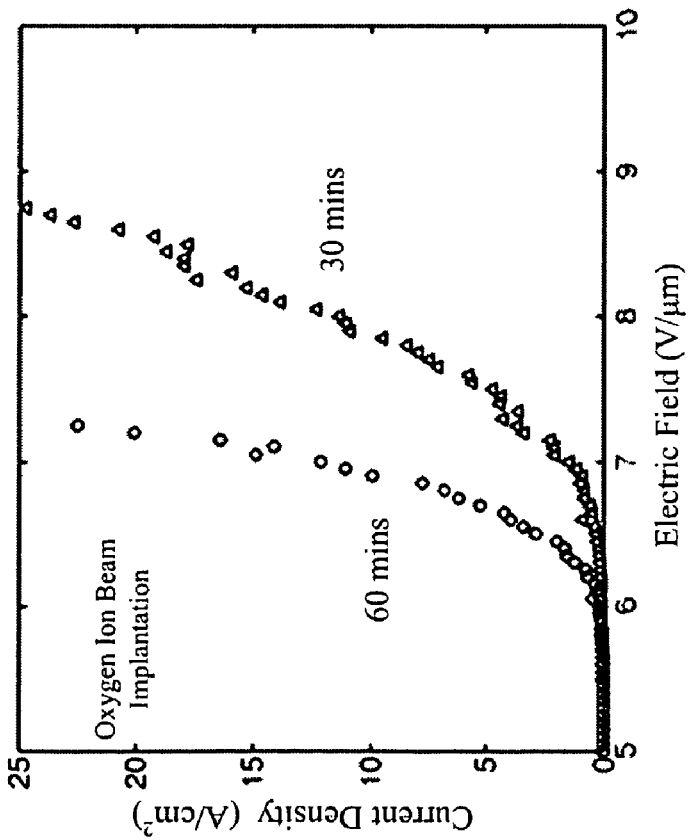
Figure 6D:
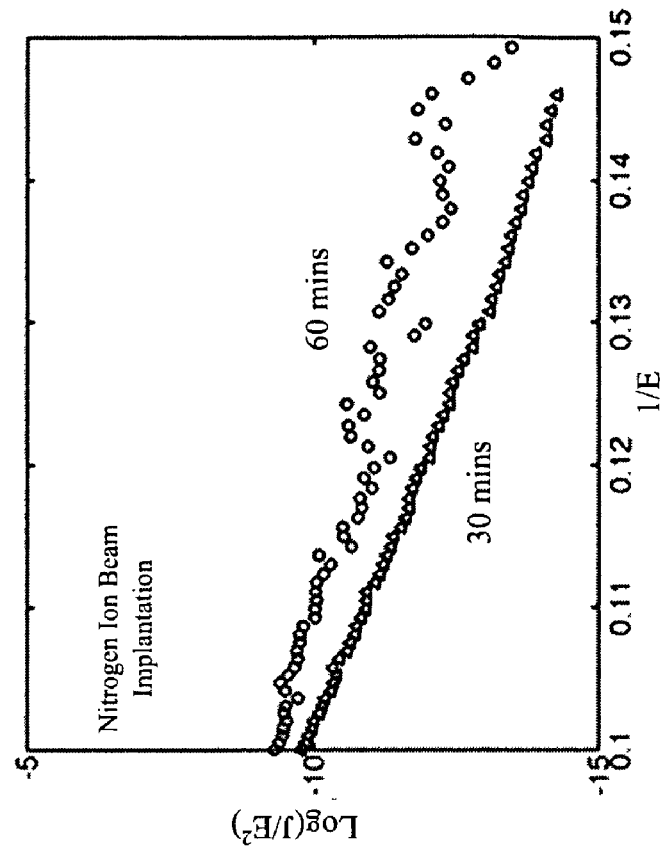
FIGS. 6c and 6d depict field emission measurement of ZnO nanopins which are fabricated by nitrogen ion beam implantation and thermal oxidation.
Figure 6C:
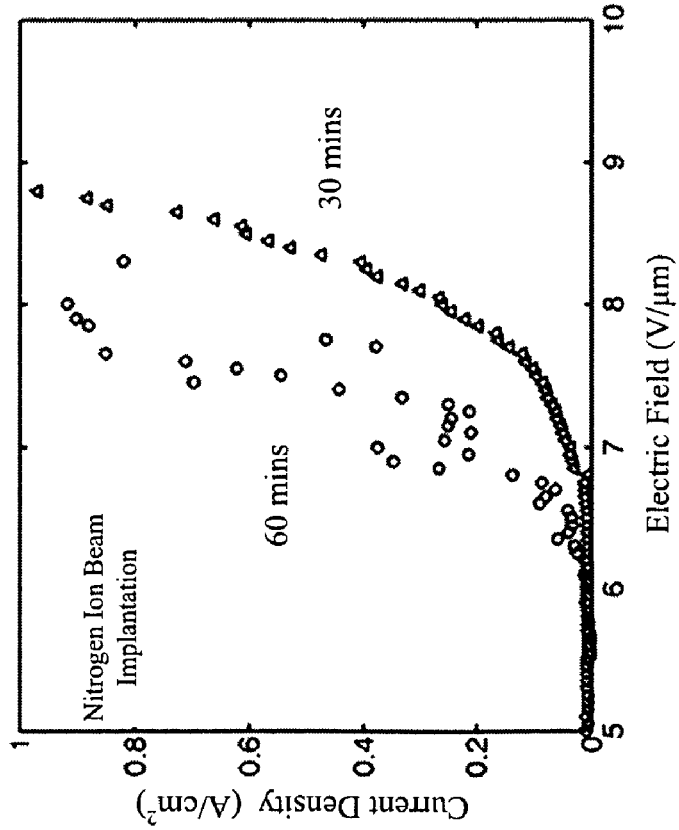
Figure 6F:
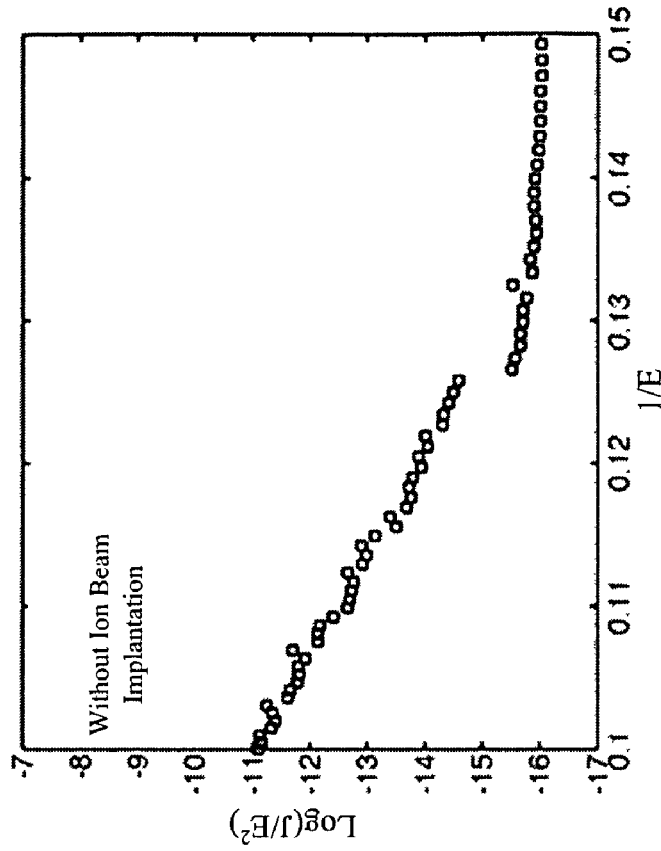
FIGS. 6e and 6f depict field emission measurement of ZnO nanopins which are fabricated without ion beam implantation.
Figure 6E:
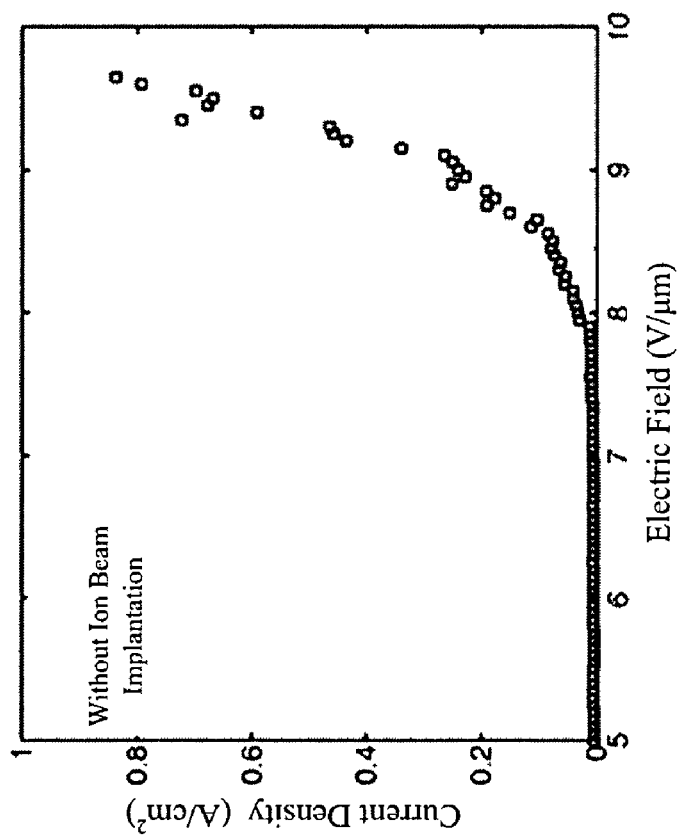

For manufacturing zinc oxide (ZnO) nanopins, the process will be described herein. In the beginning, an argon gas is introduced to pass through a capillaritron nozzle to be plasmanized. With an argon ion beam of 10 keV, anode current of 350 μA, a zinc foil is bombarded for 15 minutes to be polished. Then, an oxygen gas is introduced to pass through the capillaritron nozzle. With oxygen plasma of 16 keV, anode current of 50 μA, the polished zinc foil is impinged by the oxygen plasma for 60 minutes (or 30 minutes). In the end, the zinc foil is heated at 380□ for 3 hours in an oxidation furnace. FIGS. 6a and 6b depict the field emission properties of ZnO nanopins fabricated by oxygen ion beam implantation. FIGS. 6c and 6d depict the field emission properties of ZnO nanopins fabricated by nitrogen ion beam implantation. FIGS. 6e and 6f depict the field emission properties of ZnO nanopins fabricated without ion beam implantation. In comparison with FIG. 6a and FIG. 6e, without ion beam implantation and oxygen ion beam implantation for 60 minutes, the threshold field to emit electrons is reduced from 9.0 V/μm to 6.5 V/μm. In addition, when an electric field of 10 V/μm is applied, the current density of emitted electrons is increased from 20 μA/cm² to 170 μA/cm². It is indicated that the density of the ZnO nanopins and the field emission properties of the ZnO nanopins are indeed improved. Moreover, replacing oxygen ion beam implantation with nitrogen ion beam implantation will lead to similar results but the field emission properties obtained by utilizing the nitrogen ion beam implantation is inferior. This is because two kinds of ions, $O^+$ and $O^{2+}$ are involved during the oxygen ion beam implantation while only one kind of ion, $N^+$, is involved during the nitrogen ion beam implantation. Because the $O^+$ and $O^{2+}$ ions make more pore structures in the zinc foil, the field emission properties obtained by utilizing the oxygen ion beam implantation are superior to that utilizing the nitrogen ion beam implantation. In addition, the field emission properties obtained by utilizing the oxygen ion beam implantation for 60 minutes are superior to that utilizing the oxygen ion beam implantation for 30 minutes.

While the preferred embodiments of the present invention have been illustrated and described in detail, various modifications and alterations can be made by persons skilled in this art. The embodiment of the present invention is therefore described in an illustrative but not restrictive sense. It is intended that the present invention should not be limited to the particular forms as illustrated, and that all modifications and alterations which maintain the spirit and realm of the present invention are within the scope as defined in the appended claims.

What is claimed is:

1. A nanopin manufacturing method, comprising steps of:
   introducing a bombarding gas to pass through a capillaritron nozzle;
   plasmanizing the bombarding gas by a voltage applied to the capillaritron nozzle for spurting the plasmanized bombarding gas to form an ion beam; and
   bombarding a foil with the ion beam to form nanopins on a surface of the foil, wherein temperature of the foil is controlled for altering a tip angle of the nanopins.

2. The nanopin manufacturing method of claim 1, wherein an end radius of the nanopins is less than 10 nm.

3. The nanopin manufacturing method of claim 1, wherein an aspect ratio of the nanopins is greater than 25.

4. The nanopin manufacturing method of claim 3, wherein the aspect ratio of the nanopins is between 25 and 30.

5. The nanopin manufacturing method of claim 1, wherein the tip angle of the nanopins is smaller than 3 degrees.

6. The nanopin manufacturing method of claim 1, wherein the bombarding gas is an argon gas.

7. The nanopin manufacturing method of claim 1, wherein the foil is selected from a group consisting of a zinc foil, a tungsten foil, and a tantalum foil.

8. The nanopin manufacturing method of claim 7, wherein the foil is the zinc foil.

9. The nanopin manufacturing method of claim 1 further comprising steps of:
   plasmanizing an implanting gas; and
   impinging upon the foil with the plasmanized implanting gas.

10. The nanopin manufacturing method of claim 9 further comprising a step of oxidizing the foil for forming oxide nanopins on the foil.

11. The nanopin manufacturing method of claim 10, wherein the foil is heated in an oxidation furnace.

12. The nanopin manufacturing method of claim 9, wherein the implanting gas is an oxygen gas.

13. The nanopin manufacturing method of claim 9, wherein the implanting gas is a nitrogen gas.

* * * * *